(12) United States Patent
Xu et al.

(10) Patent No.: US 8,498,602 B2
(45) Date of Patent: Jul. 30, 2013

(54) ARCHITECTURE OF FUTURE OPEN WIRELESS ARCHITECTURE (OWA) RADIO SYSTEM

(76) Inventors: Limei Xu, Mountain View, CA (US); Wei Lu, Cupertino, CA (US)

( * ) Notice: Subject to any disclaimer, the term of this patent is extended or adjusted under 35 U.S.C. 154(b) by 53 days.

(21) Appl. No.: 13/305,419

(22) Filed: Nov. 28, 2011

(65) Prior Publication Data
US 2013/0135029 A1    May 30, 2013

(51) Int. Cl.
H04B 1/10     (2006.01)
H04B 1/26     (2006.01)

(52) U.S. Cl.
USPC .......................................... 455/307; 455/323

(58) Field of Classification Search
USPC ................. 455/307, 313, 318, 323, 333, 334, 455/341
See application file for complete search history.

(56) References Cited

U.S. PATENT DOCUMENTS

| | | | |
|---|---|---|---|
| 2005/0130618 A1* | 6/2005 | Staszewski et al. | 455/255 |
| 2007/0105587 A1* | 5/2007 | Lu | 455/552.1 |
| 2009/0270061 A1* | 10/2009 | Hosokawa et al. | 455/323 |
| 2011/0199122 A1* | 8/2011 | Morishita et al. | 327/2 |
| 2011/0221507 A1* | 9/2011 | Hosokawa et al. | 327/355 |

* cited by examiner

*Primary Examiner* — Nguyen Vo

(57) ABSTRACT

This invention relates to an open wireless architecture (OWA) radio frequency (RF) transceiver architecture including RF front-end system. Specifically, the invention relates to an OWA RF front-end utilizing non-broadband RF hardware to support wide range frequency bands and broad transmission bandwidth for future wireless communications.

17 Claims, 5 Drawing Sheets

Architecture of Future OWA Radio

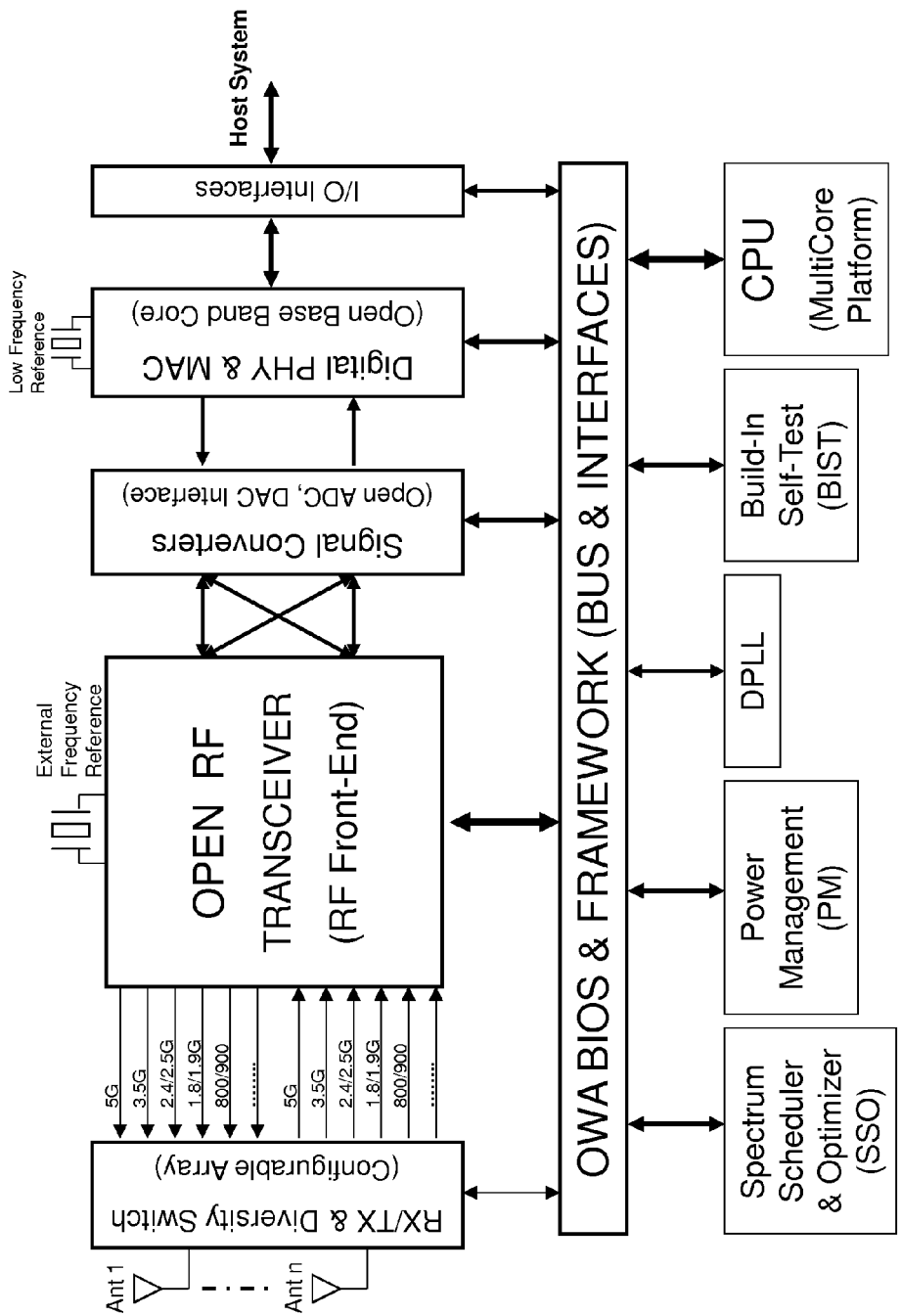
FIG.1 Architecture of Future OWA Radio

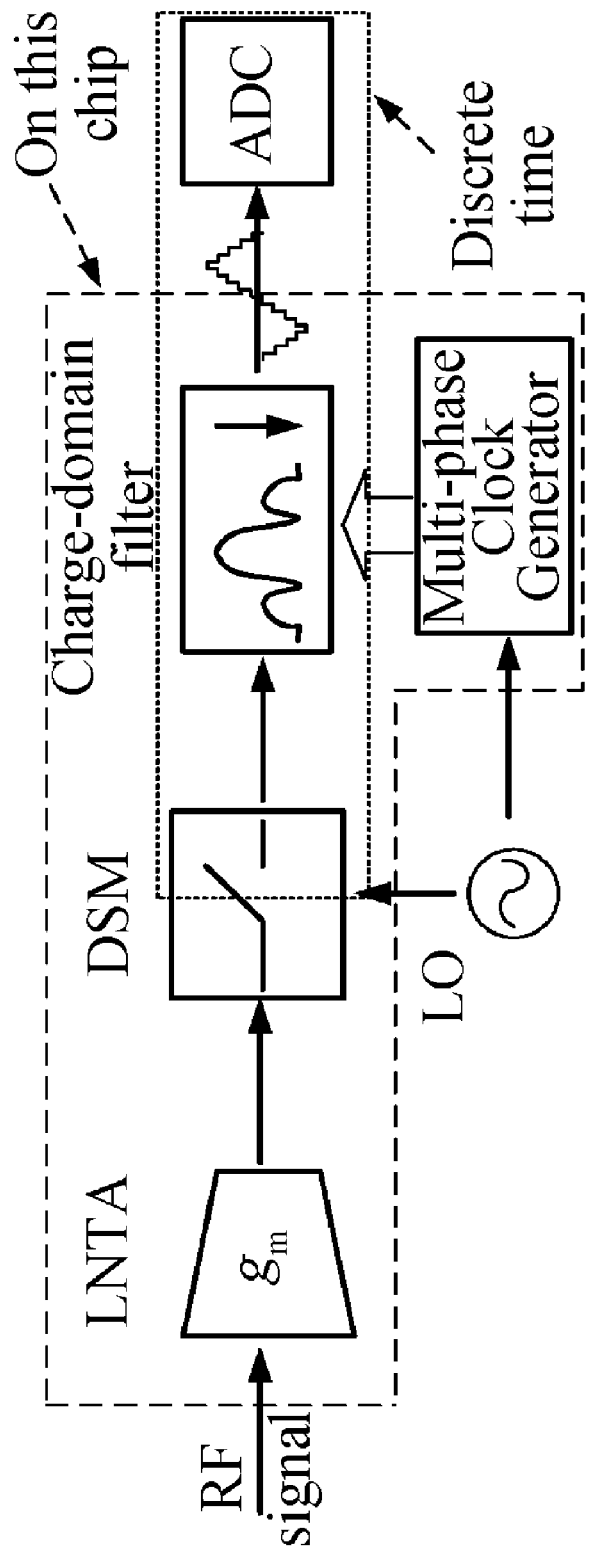
FIG. 2: OWA RF Front-End

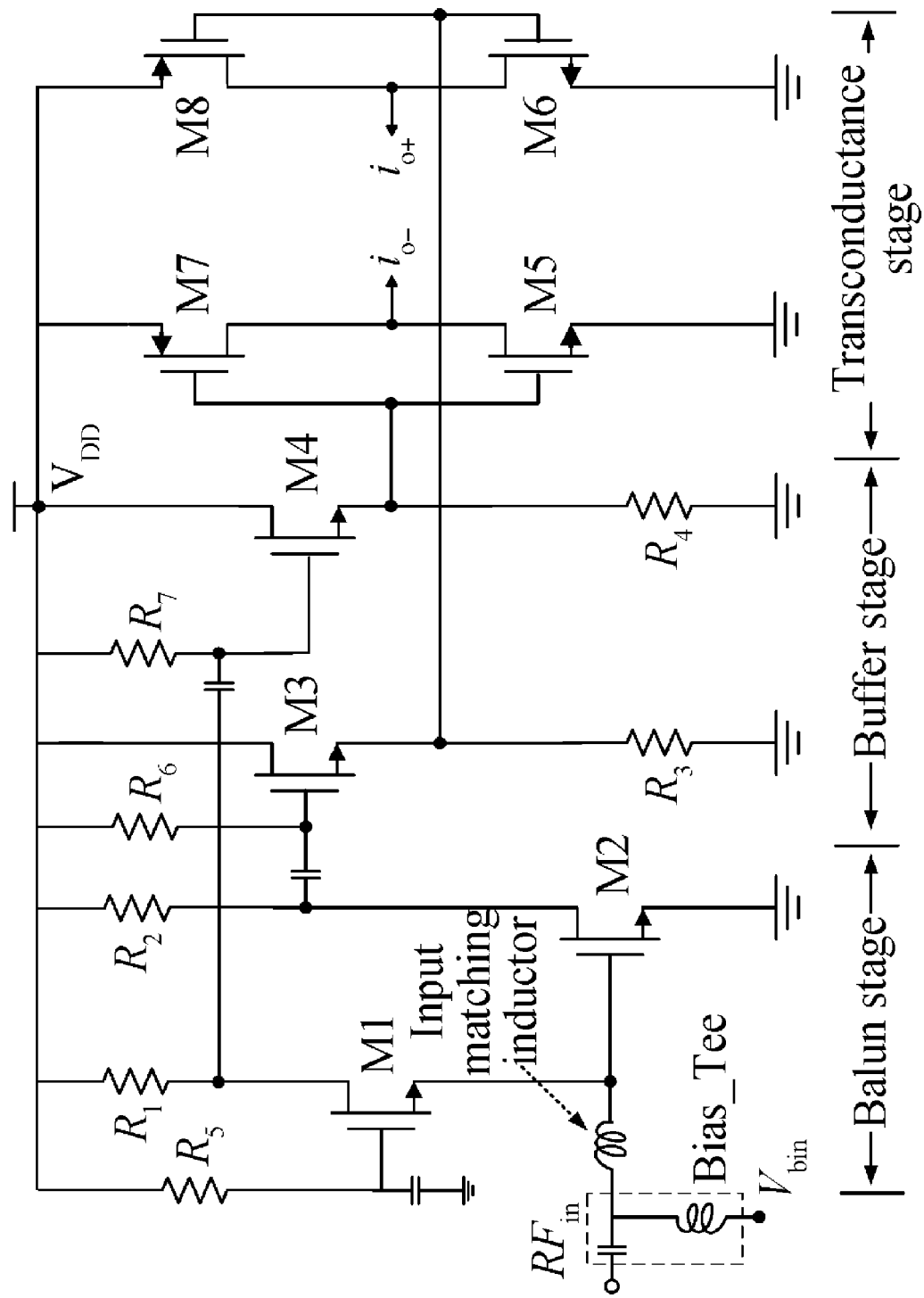
FIG. 3: OWA Low Noise Transconductance Amplifier (LNTA)

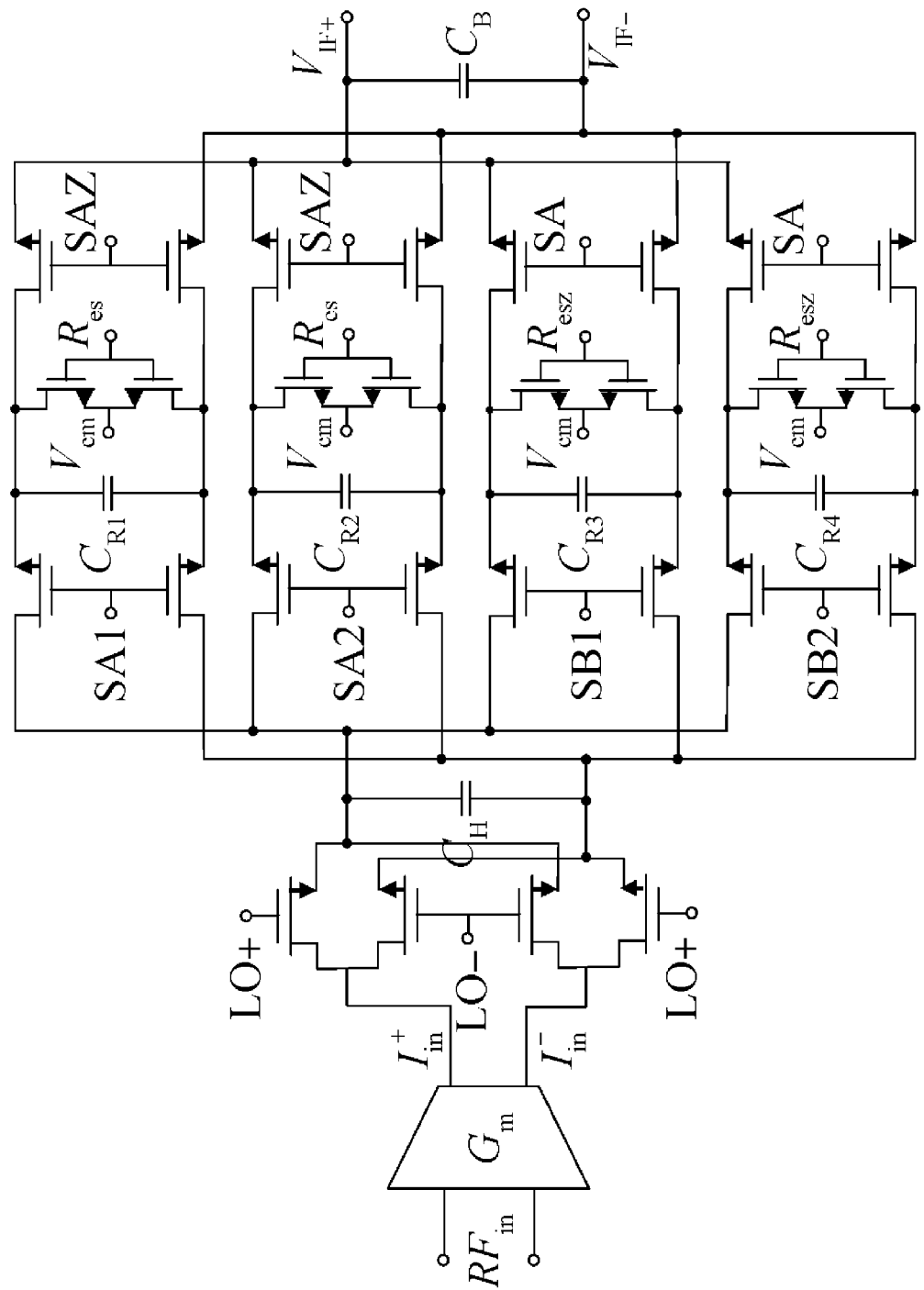
FIG. 4: OWA Direct Sampling Mixer with Discrete-Time Filtering (DSMF)

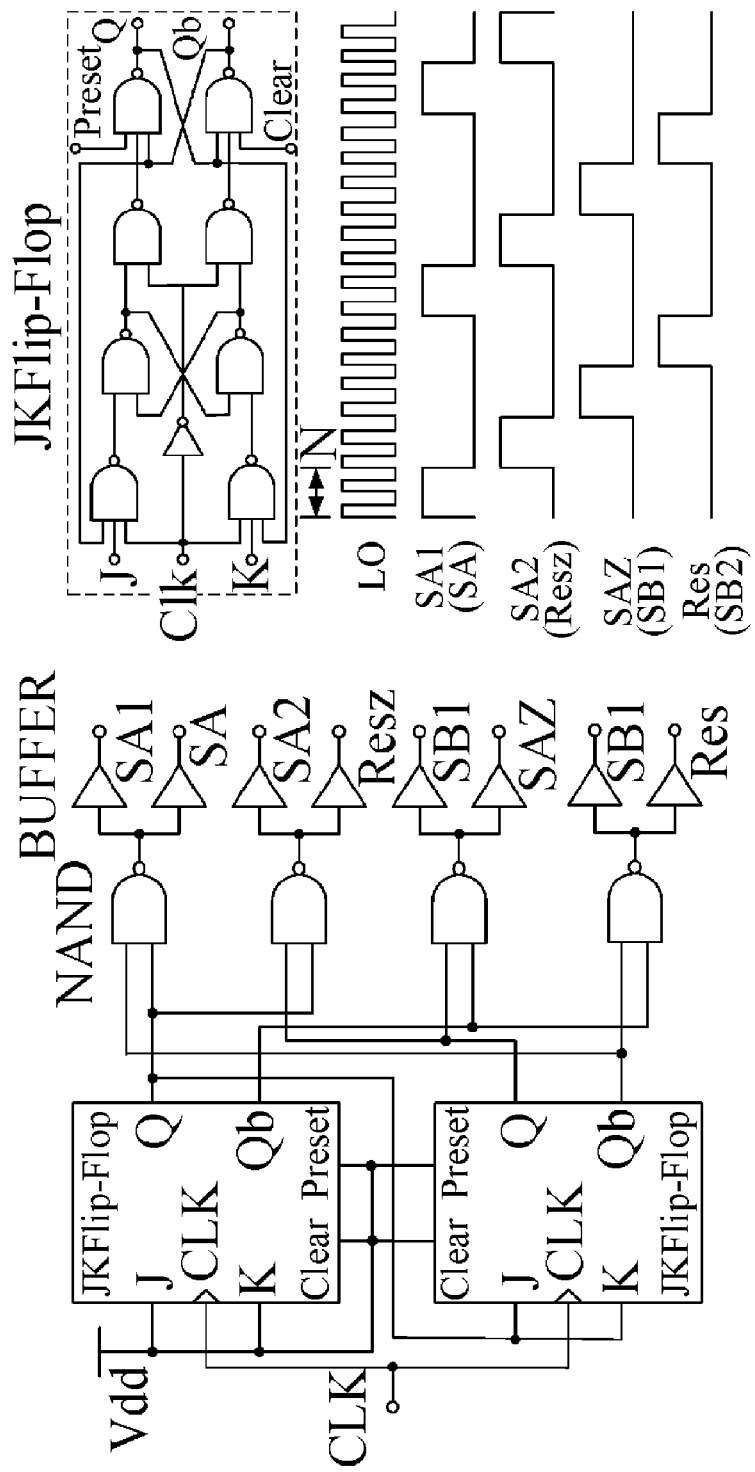
FIG. 5: Clock Generator and Clock Diagram for DSMF

ARCHITECTURE OF FUTURE OPEN WIRELESS ARCHITECTURE (OWA) RADIO SYSTEM

BACKGROUND OF THE INVENTION

1. Field of the Invention

This invention relates to an open architecture of future radio system supporting multi-bands, multi-standards wireless and mobile communications and enabling extensibility and upgradeability of the system modules including, but not limited to, radio frequency transceiver including front-end, signal converter and base-band processing core, wherein the open system platforms are based on the open wireless architecture (OWA) technology. The OWA radio frequency transceiver utilizes non-broadband hardware to support wide range frequency bands and broad transmission bandwidth which is different from the conventional software defined radio approach.

2. Description of the Related Art

With the proliferation of wireless standards in television, radio and mobile communications, compatibility issues have emerged in wireless networks and systems. Inconsistency between wireless standards is causing problems to subscribers, wireless network operators and equipment vendors. Subscribers are forced to change their handsets whenever the latest breed of standards is introduced. Network operators face the dilemma during the upgrade of a network from one generation to another due to the presence of a large number of subscribers using legacy handsets incompatible with newer generations of standards. Equipment vendors face difficulty in airing new technology because of short time-to-market requirements. Inconsistency between wireless standards is inhibiting deployment of global roaming facilities and causing problems in introducing new features and services. Users are expecting more from their mobile terminals in terms of quality of service and multimedia applications. Traditional wireless systems, with their capabilities hard-coded in them, are no longer able to keep step with this brisk growth rate.

Open Wireless Architecture (OWA) technology is the solution to the issues mentioned here. The term OWA refers to the open broadband platform, both in radio frequency (RF), baseband, network and application, that can support diverse communication standards and can integrate multiple wireless networks and systems into one common platform. To achieve this flexibility and extensibility, OWA focuses on all aspects of a communication system such as RF section, baseband processing and application domains. The flexibility and adaptability required for the converged wireless platform can be achieved by implementing the radio functionality as software modules running on a generic platform or by using extensible hardware modules.

Continuous evolution is foreseen in future mobile terminals, with use of new components, architectures, hardware, software platforms and improved user interfaces together providing increased performance. The key technologies that will enable the future advanced mobile terminals as described in the present invention include:

a) Open Wireless Architecture (OWA) supporting multiple standards efficiently
b) Mobile Cloud technology to simplify the mobile terminal architecture
c) Migrating the service from the carrier-centric to the user-centric platform
d) Smart antennas and new space/time coding and decoding techniques
e) High efficiency power amplifiers and filters
f) Improved RF (radio frequency) modules, allowing higher operating frequencies and improved receiver sensitivity
g) Advances in signal processing, increased processing efficiency
h) Improved battery technology with increased energy density
i) High-performance and low-power signal processing and processor platform based on OWA
j) Integration and convergence with wired terminal A unified global standard of mobile communications becomes extremely difficult and almost impossible. An Open Wireless Architecture (OWA) based converged wireless platform will thus become reasonable and feasible in both business and technology, and therefore ITU (international telecommunication union) IMT-Advanced standardization has been targeting this direction in long run.

Open Wireless Architecture (OWA) technology is one optimal solution for the Fourth Generation wireless and mobile communications (4G) and beyond on the worldwide basis. OWA refers to the open broadband wireless platform that can support diverse wireless and mobile standards, and can converge multiple wireless networks. To achieve this flexibility, OWA focuses on all aspects of a communication system including RF (radio frequency), baseband processing, networking and application segments. The flexibility and adaptability required for the converged open wireless platform can be achieved by defining the open interface parameters for the OWA systems and networks.

OWA helps in realizing global roaming facilities and seamless networking capabilities amongst different radio transmission technologies. It allows the network operators and subscribers to use third party solutions or user-defined solutions on their systems and to customize their systems according to their business models. Using OWA we can build systems which support multiple standards, multiple bands, multiple modes and offer diverse services to the customers.

OWA is different from SDR (software defined radio) as OWA basically maps various wireless standards into open interface parameters and maintain the system platform including RF, baseband, networks and applications an open architecture. Hence, in OWA systems, different modules (both hardware and software) can be from different vendors. It is similar to the open computer architecture in personal computer system and open network architecture in packet router system.

However, SDR is primarily a broadband radio in which the preset operating parameters including inter alia frequency range, modulation type, and/or output power limitations can be reset or altered by software in order to support different radio frequency bands and/or standards. Though SDR has been improved a lot to support re-configurability and flexibility, it is a closed architecture in coupling different radios into one broadband transceiver hardware. In other words, SDR consumes much more power and spectrum in exchange of the system flexibility. From the business point of view, SDR is not a cost-effective solution in wireless communications.

Furthermore, SDR uses broadband transceiver hardware to support multiple wireless standards which is very expensive in the commercial environment. However, OWA converges multiple air interfaces in an open system platform to maximize the transmission bandwidth and system performance, but each wireless transmission still uses the narrowband transceiver, therefore maintaining the system in a cost-effective way which is very important for the commercial business. Furthermore, OWA supports multiple wireless air interfaces in same open wireless system platform without relying on broadband transceiver hardware which is an innovative approach for the future mobile wireless device.

By using OWA technology, we can converge multiple wireless standards in one open system to support both broadband high-speed radio transmission and seamless fast mobility capability in a mobile fast-fading propagation model environment while maintaining the very high mobile network capacity for the commercial mobile business.

In addition, OWA allows allocating multiple air interfaces into an external card so that the users can simply change wireless standards by updating such air interface card without having to change the mobile terminal device or terminal system.

Cognitive Radio is also different from OWA because the cognitive radio is a radio which has the capability of sensing and adapting to the environment and spectrum automatically and intelligently. However, cognitive radio is not an open system from the architecture point of view, and does not meet the requirements of the open system definition.

With this OWA architecture, the key system units including RF transceiver, CPU (central processing unit) platform and base-band processing core are fully open and extensible, especially the open RF transceiver can be operable in either statically allocated spectrum bands, or in dynamically optimized spectrum bands based on spectrum sharing and spectrum recycling techniques which maximize the spectrum utilization.

With this OWA architecture, many system modules including, but not limited to, the RF front-end module, Digital controlled oscillator module, IF (intermediate frequency) processing module, Build-In Self-Test module, Signal Converter module and Base-band processing module can be replaced, extended and upgraded by the users, and developed by the third-party vendors.

INTRODUCTION OF THE INVENTION

This invention is directed to an architecture of future open wireless architecture (OWA) radio system which provides an open, extensible, reconfigurable and upgradeable system platform supporting multi-bands, multi-standards wireless and mobile communication technologies, either in the statically allocated frequency spectrum bands or in the dynamically optimized spectrum bands based on spectrum sharing and spectrum recycling techniques, wherein the main system units and modules including RF (radio frequency) transceiver (including RF front-end) and base-band processing core are upgradeable and plug-and-play through the OWA BIOS (basic input/output system) and Framework open interface definitions.

The architecture of future open wireless architecture (OWA) radio system of the present invention incorporates an OWA BIOS (basic input/output system) AND FRAMEWORK architecture which defines the open bus and interfaces architecture to manage the "plug and play" open architecture of the whole OWA radio systems, as well as provides the extensibility and upgradeability of the different system units and functional modules.

More specifically, the architecture of future open wireless architecture (OWA) radio system of the present invention comprises the utilization of OWA BIOS and Framework, as set forth above, constructing the Open RF (radio frequency) Transceiver including RF front-end, wherein multi-bands transmitters array and multi-bands receivers array are reconfigurable and upgradeable through OWA extensible interfaces, defined by aforementioned OWA BIOS and Framework. Further specifically, the architecture of future open wireless architecture (OWA) radio system of the present invention incorporates such Open RF Transceiver including receiver RF front-end and transmitter RF front-end, operative in multiple common frequency bands such as 5 GHz, 3.5 GHz, 2.4 GHz/2.5 GHz, 1.8 GHz/1.9 GHz and 800 MHz/900 MHz, but not limited thereto, capable of short range wireless communications, wireless local area networks as well as large area cellular mobile communications. Furthermore, the Open RF Transceiver, as set forth above, is also operative in dynamically allocated spectrums, such as spectrum sharing and spectrum recycling, but not limited thereto. More specifically, the Open RF Transceiver, as set forth above, comprises an RF Front-End both in transmitter and receiver, and the related digital phase lock loop, frequency synthesizer and RF power amplifier, but not limited hereto, in supporting multi-bands transceiver array architecture, as illustrated above.

The architecture of future open wireless architecture (OWA) radio system of the present invention incorporates a multi-cores processing platform with well-defined targets from algorithmic, software and architecture standpoint for the OWA system, wherein different functional modules such as, but not limited to, aforementioned Open RF Transceiver including RF Front-End, Signal Converter, Open base-band processing Core, Antenna Array and Build-In Self-Test, are capable of operating separately and in parallel, facilitating extensible and reconfigurable system platform, as set forth in details above.

The architecture of future open wireless architecture (OWA) radio system of the present invention also incorporates the layered OWA system framework, as set forth in part above, comprising the physical layer framework including, but not limited to, the aforementioned open RF transceiver, open ADC/DAC (analog-to-digital converter and digital-to-analog converter), the aforementioned open base-band core and antenna array; middle ware layer framework including, but not limited to, OWA device drivers supporting aforementioned RF transceiver, ADC/DAC, baseband core and network devices, OWA real-time OS (operating system) with network protocol capability and OWA API (application programming interface) supporting underlying physical layer system units; application layer framework supporting the services and applications of different wireless transmission technologies. Furthermore, the OWA API, as set forth above, is in charge of high layer system management including, but not limited to, resource management (channel, network, bandwidth, capacity and antenna), spectrum management (band identification, location, spectral condition, index and priority) and power management (sleep mode, standby mode, receiving mode and transmitting mode as well as their cloud operation modes).

In addition to the above, the architecture of future open wireless architecture (OWA) radio system of the present invention also include the firmware flow architecture capabilities of the OWA BIOS and Framework, as set forth above, comprising the task modules such as, but not limited to, OWA Security, OWA Initialization, OWA Drivers, OWA Network Boot, OWA OS Load, OWA Network Optimization, OWA Run-Time and OWA Termination, wherein such architecture is capable of integrating the future wireless architecture with the computer architecture to construct the OWA future radio system. As set forth above, the firmware flow architecture may be pre-established and determined based on current technological standards and may vary greatly.

One advantage of the architecture of future open wireless architecture (OWA) radio system of the present invention which may serve as an incentive is the concept of "spectrum sharing and spectrum recycling". More specifically, the system provides the capability of users and providers to utilize the existing common frequency bands through the extensible transceiver array, as set forth above, or to search for the available spectrum, both licensed or unlicensed, based on spectrum management, as set forth in details above, wherein the system provides real-time view of available spectrum resource.

Other features of the architecture of future open wireless architecture (OWA) radio system of the present invention comprise the open RF transceiver, as set forth above, whether incorporating cellular mobile technology, local wireless access technology, short-distance wireless technology or its equivalent, including a network searching capability wherein searching for different air interfaces in certain bands based on various criteria such as, but not limited to, signal strength, waveform, frequency, coding and modulation, and whenever necessary, the aforementioned open RF transceiver can replace its transceiver array with other portable "plug-and-play" components such as, but not limited to, RF Power Amplifier, RF Receiver Front-End, RF Transmitter Front-End.

OWA RF Front-End system supports open wireless air interfaces by using non-broadband RF hardware for the consumer markets in the cost-effective and spectrum-efficient way.

To facilitate the OWA RF front-end supporting wideband frequency bands from 500 MHz to 6 GHz for open wireless air interfaces without relying on broadband RF hardware, the architecture of future open wireless architecture (OWA) radio system of the present invention utilizes the following innovations disclosed in the present invention:

a) Direct RF sampling technique allowing great flexibility in the OWA radio system
b) Built-in filtering technique processing RF signal in discrete time and charge domain
c) Charge sampling having advantages over voltage sampling
d) RF MOS (metal-oxide-semiconductor) technique across wide range of frequency bands The present invention comprises a low noise transconductance amplifier (LNTA) and a direct RF sampling mixer (DSM) with embedded programmable discrete-time filtering. The LNTA has the features of wideband in nature, input matching and low noise. The embedded filters following the DSM operates in discrete-time charge domain, filtering the aliasing signals and interferences while controlling the IF bandwidth according to the clock frequency.

Charge sampling has advantage over conventional voltage sampling. In voltage sampling, the bandwidth of the sample and hold system is limited by the value of the on-resistance and capacitance. However, charge sampling does not track the signal voltage but integrates the current into the sampling capacitors. The transconductor can provide an almost constant output current across very wide frequency bands up to 10 GHz to charge the sampling capacitors. Furthermore, the value of the capacitance can be so large that both noise and clock/charge feedthrough are largely reduced.

These and other features and advantages of the present invention will become more clear when the drawings as well as the detailed description are taken into consideration.

BRIEF DESCRIPTION OF THE DRAWINGS

For the full understanding of the nature of the present invention, reference should be made to the following detailed descriptions with the accompanying drawings in which:

FIG. 1 is the architecture of the future Open Wireless Architecture (OWA) radio system, supporting multiple wireless standards in an integrated and converged open common platform.

FIG. 2 is the architecture of open wireless architecture (OWA) RF front-end with wideband frequency range from 500 MHz up to 6 GHz.

FIG. 3 is the architecture of low noise transconductance amplifier (LNTA).

FIG. 4 is the RF direct sampling mixer with discrete-time filtering (DSMF).

FIG. 5 is multi-phase clock generator providing the required clocks for the OWA RF Front-End.

Like reference numerals refer to like parts throughout the several views of the drawings.

DESCRIPTION OF THE PREFERRED EMBODIMENT

The present invention relates to an implemental and commercial multi-bands common wireless and mobile communication platform for the future open wireless architecture radio system.

FIG. 1 is the architecture of future OWA radio of the present invention. The key system units are:

Open RF (Radio Frequency) Transceiver including RF Front-End—it converts the radio frequency (RF) signal into the low frequency or intermediate frequency (IF) signal, and vice verse. It also down-converts the radio signal into the base-band signal after sampling, and vice verse. This transceiver is designed for open architecture which means the whole transmitting and receiving pipes support multi-bands and multi-standards wireless transmission technologies including existing and future over-the-air radio technologies.

Receiver/Transmitter (RX/TX) and Diversity Antenna Switch—it contains the configurable antenna arrays and the antenna technologies of space and time diversity, including (but not limited to) the smart antenna technology, digital beam forming technology, Multi-Input and Multi-Output (MIMO) technology and antenna calibration technology.

The aforementioned Open RF Transceiver and RX/TX unit support multi-bands of radio frequency spectrum bands including around 5 GHz band, 3.5 GHz band, 2.4 GHz/2.5 GHz band, 1800 MHz/1900 MHz band, and 800 MHz/900 Mhz band, from 500 MHz up to 6 GHz, but not limited thereto, covering the common radio air interfaces of WLAN (wireless local area network), WPAN (wireless personal access network), BWA (broadband wireless access) and mobile cellular networks, such as GSM (global services for mobile communications), CPRS (GSM packet radio service), CDMA (code division multiple access) and OFDMA (orthogonal frequency division multiplexed access), but not limited thereto.

Signal Converters—it converts the analog frequency signal into the digital data stream, and vice verse. These converters are designed with open architecture platform based on OWA interfaces so that the converters can be reconfigurable, upgradeable and in plug-and-play mode.

The connection between the aforementioned Open RF Transceiver and Signal Converters is a cross network matrix to support the future convergence and integration of RF transceiver and digital conversion, for example, ADC (Analog to Digital Converter) and DAC (Digital to Analog Converter) will be integrated into the RF Transceiver system. In other words, the boundary of digital processing should be moved as close as possible to the antenna, and thus for the OWA radio system, the typical place for ADC and DAC is in the aforementioned Open RF Transceiver.

Digital PHY (physical layer) and MAC (medium access control layer)—it constructs the open base band processing core to process various transmission algorithms, access control protocols and resource management protocols, etc. It is an open and common base-band processing platform for the OWA system.

OWA BIOS (basic input/output system) and Framework—it defines the OWA bus architecture and interfaces architecture to manage the "plug and play" open architecture of the whole OWA system. It also schedules the operations of the different functional modules and units of the OWA radio system.

CPU (central processing unit)—it is a multi-cores processing platform which have well-defined targets from algorithmic, software and architecture standpoint for the OWA system, as well as best combinations of system optimizations and algorithms for future requirements on security, privacy, usability and reliability.

Spectrum Scheduler and Optimizer (SSO)—it manages the dynamic spectrum sharing and spectrum recycling technologies for maximizing the spectrum utilization in OWA system. Dynamic spectrum management is extremely important for future wireless communications because it provides real-time view of available spectrum resource, and makes use of the spectrum more efficiently, productively and flexibly.

Power Management (PM)—it optimizes the power consumption and power scheduling across the whole functional units of the OWA system. It also defines the best-effort solutions for the terminal power manager on different operation modes: Sleep, Standby, Receiving and Transmitting as well as their cloud operation modes.

Build-In Self-Test (BIST)—it is an important system unit for self testing, operation and maintenance (O&M) debugging, performance and evaluation testing of the OWA system. It is also one of the necessary tasks in the system initialization process.

Other functional units include Input/Output (I/O) interface and Digital Phase Lock Loop (DPLL) which are required in the design of the OWA radio system.

The aforementioned OWA BIOS and Framework is one of the most important implemental core platforms to design this OWA radio system because:
a) It defines the common bus and interface architectures to enable each functional unit of the radio system the "plug and play" feature in the OWA radio implementation;
b) It converges and integrates the OWA system with the computer architecture platform.

In the advanced digital RF (radio frequency) technology, the direct sampling mixer (DSM) in the discrete time have the functions of down-conversion, decimation and filtering wherein the down-conversion is in the form of charge sampling, and decimation and filtering are handled by the embedded switched capacitor filter.

The low noise transconductance amplifier (LNTA) is utilized to provide wideband receiving mechanism for RF signal from 500 MHz up to 6 GHz, but not limited thereto, before inputting to the aforementioned DSM with enough bandwidth. In theory, the aforementioned DSM does not have much limitation in processing bandwidth and frequency band of the common wireless air interfaces.

The direct RF sampling and build-in filtering solution provides signal processing in discrete time and charge domain which supports low power consumption and optimal processing performance, and ensures the design balance between low voltage supply and high linearity requirements. In addition, charge sampling is much better than voltage sampling in performance in that it does not track the signal voltage but integrates the current into the sampling capacitor, while in voltage sampling, the bandwidth of the sample and hold system are limited by the value of the on-resistance and capacitance. Hence, the transconductor can ensure an almost constant output current up to several GHz to charge the sampling capacitor. Furthermore, the value of the capacitance could be so large that noise, clock and charge feedthrough can be greatly reduced.

FIG. 2 shows the general system architecture of the open wireless architecture (OWA) RF front-end with wideband frequency range from 500 MHz up to 6 GHz based on the system units as set forth above. With this high-efficient RF front-end, the ADC (analog to digital converter) can be greatly simplified.

FIG. 3 illustrates the architecture of low noise transconductance amplifier (LNTA) which comprises three system units related to three signal processing stages:
a) Balun Stage Unit The RF signal firstly goes through band-pass filter and input matching circuit before loaded into the RF amplifier systems. To accommodate an RF signal from 500 MHz up to 6 GHz, a wideband low noise amplifier (LNA) is necessary, based on active BALUN (BALance and UNbalance) architecture to match the different antenna characteristics, wherein the common-gate common-source amplifier topology is utilized due to its features of wideband input matching and cancelling of both noise and nonlinearity. To achieve low noise performance of the aforementioned balun LNA, the first load resistance $R_1$ of first NMOS (N-type metal-oxide-semiconductor) transistor M1 is chosen to be several times, for example three times, but not limited thereto, of the second load resistance $R_2$ of second NMOS transistor M2, while $g_m$ (the ratio of the current change at the output port to the voltage change at the input port) to the aforementioned M2 is same times of $g_m$ to the aforementioned M1.

In this stage, the RF signal is converted from the un-balanced (single-ended) to the balanced about ground (differential) way, and gets amplified with very low noise performance.
b) Transconductance Stage Unit With this complementary transconductor, the sizes of NMOS transistors M5 and M6 as well as PMOS (P-type metal-oxide-semiconductor) transistors M7 and M8 are large enough to obtain a sufficient transconductance from this stage.

In this stage, the output current becomes proportional to its input voltage or the current change at the output is proportional to the voltage change at the input.
c) Buffer Stage Unit If the transconductor follows after the balun directly, the big difference in the time constant (RC—resistance times capacity) at the interface will cause phase and magnitude imbalance severely towards the high-frequency of the band. To solve this problem, a source follower buffer is inserted between the aforementioned balun stage and the aforementioned transconductance stage. Meanwhile, the Input matching inductor in the aforementioned balun stage is also used to simulate the inductive effect of the bonding wire which helps improve the input matching at high frequencies.

In this stage, it helps reduce the phase and magnitude imbalance between the balun stage and the transconductance stage, as set forth above.

Through aforementioned wideband LNTA, the received RF signal is converted from voltage domain to RF current which is then switched by the Local Oscillator (LO) and window-integrated into the sampling capacitors in the aforementioned DSM.

FIG. 4 discloses the RF direct sampling mixer with discrete-time filtering (DSMF) which comprises the following system units:

a) LO Switch Unit

From the aforementioned Transconductance stage ($G_m$), the amplified balanced RF current is switched by the LO (local oscillator) signal and integrated into the sampling capacitors $C_H$ and $C_R$, which forms the charge sampling. To reduce and stabilize the on-resistance of the aforementioned LO switches even under large input signal conditions, the complementary CMOS (complementary metal-oxide-semiconductor) switches are used here. Furthermore, the larger the sampling capacitor used in the circuit, the lower the sampling noise and clock feedthrough.

b) Sampling and Rotating Unit

Clocks $SA_{1,2}$, $SB_{1,2}$ have non-overlapping time windows that let successive N samples be integrated into the sampling capacitors, which performs moving average and results in FIR (finite impulse response) filter mainly for anti-aliasing filtering. Distributing the integrated charge between the aforementioned sampling capacitors $C_H$ and $C_R$ (or call $C_R$ as rotating capacitor) at a rate of $f_{LO}/N$ (frequency of LO clock/N samples) switched by the aforementioned clocks $SA_{1,2}$, $SB_{1,2}$ becomes an IIR (infinite impulse response) filter. To prevent the aforementioned IIR filter from limiting the IF (intermediate frequency) bandwidth, the ratio between the sampling capacitor and the rotating capacitor $C_H/C_R$ is not chosen to be too large in order to have the potential to tune the bandwidth (channel bandwidth) from hundreds of kHz to tens of MHz. Non-overlapping clocks $SA_{1,2}$ successively transfer/switch the charge into the parallel rotating capacitors $C_{R1}$ and $C_{R2}$, which provides additional decimation by two, i.e. the second order spacial moving average. Of course, more branches can be parallelized to get better FIR filtering.

The parallel rotating capacitors $C_{R3}$ and $C_{R4}$ repeat the same process as $C_{R1}$ and $C_{R2}$, but are switched by non-overlapping clocks $SB_{1,2}$.

c) Output Buffering Unit

The combination charge stored in the aforementioned $C_{R1}$ and $C_{R2}$ is read out into the output buffer capacitor $C_B$ at an even lower rate $f_{LO}/2N$ switched by a clock SAZ, wherein N is the ratio of $f_{LO}/f_{CLK}$ (frequency of local oscillator and clock). The amplitude-frequency response of the composite transfer function of the discrete-time filters of the present invention include FIR and IIR filters, as set forth above.

The combination charge stored in the aforementioned $C_{R3}$ and $C_{R4}$ is read out into the output buffer capacitor $C_B$ in the same way as the aforementioned $C_{R1}$ and $C_{R2}$, but switched by a clock SA.

According to the transfer function as set forth below, by setting the aforementioned $f_{LO}$ and N, we can set the frequency band of wireless transmission to different air interfaces. In other words, by reconfiguring the aforementioned $f_{LO}$ and N, the system can utilize non-wideband transceiver hardware to support open wireless air interfaces of various different wireless standards.

d) Discharge and DC Reset Unit

In this system unit, the aforementioned $C_{R1}$ and $C_{R2}$ are discharged by reset clock $R_{es}$. They are reset to a common voltage $V_{cm}$, which is at the same level as the DC (direct current) common output voltage of the aforementioned transconductor stage to prevent DC current from flowing through the sampling mixer and the discrete-time filter in order to eliminate the flicker noise. Meanwhile, $V_{cm}$ also provides a DC common input voltage to the following stage so that the large AC (alternating current) couple capacitors and related biasing circuit are spared. Additionally, $C_H$, $C_R$ and $C_B$ are connected between the two differential paths instead of connecting one of their terminals to ground to reduce the number of capacitors needed and save capacitance area by a factor of four. At the same time, they are composed of a pair of inversed capacitors to remove the non-symmetrical effect with respect to the top and bottom plates of the capacitor.

The aforementioned $C_{R3}$ and $C_{R4}$ are discharged in the same way as the aforementioned $C_{R1}$ and $C_{R2}$, but by reset clock $R_{esz}$.

This unit provides proper IF (intermediate frequency) voltage output from the sampling mixer with discrete-time filtering to the following IF systems including ADC (analog to digital converter), etc.

FIG. 5 shows the multi-phase clock generator providing the aforementioned clocks SA1, SA2, SB1, SB2, SA, SAZ, $R_{es}$ and $R_{esz}$ wherein SA1=SA, SA2=$R_{esz}$, SAZ=SB1 and SB2=$R_{es}$.

The divide-by-four function is performed by two J-K flip flops. The master-slave architecture for the J-K flip-flop is chosen due to its stability. The output combination logic consisting of the NANDS and buffers processes the divide-by-two and divide-by-four outputs from the two J-K flip flops and generates four non-overlapping multi-phase clocks. To simplify the circuit implementation and design complexity, the clocks are elaborately designed to be multiplexed.

The frequency of the aforementioned clocks (SA1, SA2, SB1, SB2, SA, SAZ, $R_{es}$ and $R_{esz}$) has $f_{CLK}=f_{LO}/N$, wherein all of the clocks are not overlapped each other, and their initial ON time window (clock occurs in ON/OFF manner) occurs in the sequence order of SA1 (SA), SA2($R_{esz}$), SAZ(SB1) and SB2($R_{es}$).

When the aforementioned $f_{LO}$ and/or N change, the aforementioned $f_{CLK}$ will change accordingly, resulting in processing of different frequency bands of the wideband RF Front-End of the present invention. This simplified RF front-end architecture enables utilizing non-broadband RF transceiver hardware to provide wideband RF receiving by just reconfiguring the aforementioned $f_{LO}$ and N in a software manner because the aforementioned RF front-end of the present invention can first search for the RF frequency of the wireless air-interface of the wireless system and then calculate the required $f_{LO}$ and N to generate proper clocks. Then the aforementioned RF front-end of the present invention is locked to this frequency band and provide necessary bandwidth for processing of required RF and IF signals wherein the real RF hardware remains non-broadband RF hardware including narrow-band RF hardware, but not limited thereto.

The aforementioned LNTA and the aforementioned DSMF are both not limited much to frequency bands or processing bandwidth for common wireless communications of wireless air-interfaces. Therefore, the wideband RF front-end of the present invention is not limited to the broadband RF hardware, but can provide wideband features from 500 MHz up to 6 GHz by using non-broadband RF hardware.

Therefore, the OWA Wideband RF Front-End of the present invention is totally different from the conventional SDR (software defined radio) because SDR requires concrete broadband RF hardware to adjust different RF transceivers in different bands by software.

Mathematic Modeling and Analysis for LNTA and DSMF

An RF signal can be sampled by integrating its current in a given time window. The aforementioned LNTA converts the input RF voltage to the output RF current. The aforementioned DSMF comprises direct sampling mixer with discrete-time filtering wherein the filtering process comprises the first IIR (infinite impulse response) filter based on sampling capacitor $C_H$ and rotating capacitor $C_R$, and the second IIR filter based on the rotating capacitor $C_R$ and output buffer capacitor $C_B$.

When the RF current is the output of a transconductor with the transconductance of $g_m$ and the switch is controlled by the LO (local oscillator), the RF voltage gain of a single LO half-cycle is:

$$G_{v,RF} = \frac{\sin\left(\frac{\pi f_{RF}}{2 f_{LO}}\right)}{\pi f_{RF}} \frac{g_m}{c_s},$$

where $$C_s = C_H / a_1, \quad a_1 = \frac{c_H}{c_H + c_R}$$

So, most power of the signal can pass through around the aforementioned LO frequency and the power around even multiples of the aforementioned LO frequency will be totally zero. Continuously integrating N half-rectified RF samples results in a finite-impulse response (FIR) operation with N all-one coefficients known as moving-average (MA) with its frequency response as follows:

$$|H_{MA}(f)| = \left|\frac{\sin(\pi f N / f_{LO})}{\sin(\pi f / f_{LO})} \exp\left(-j \frac{N-1}{2} \frac{2\pi f}{f_{LO}}\right)\right|$$

The aforementioned MA charge is distributed between the history capacitor $C_H$ and the rotation capacitor $C_R$, which together comprise the sampling capacitor. In the next period, the charge stored in $C_H$ will be preserved while the charge in $C_R$ will be ready to read out. The charge recursive operation results in the capacity of infinite-impulse response (IIR) filtering called the first IIR filter, as set forth above.

The transfer function of the aforementioned first IIR filter is:

$$|H_{IIR1}(f)| = \left|\frac{1}{1 - a_1 \exp\left(-j \frac{2\pi N f}{f_{LO}}\right)}\right|,$$

where $$a_1 = \frac{c_H}{c_H + c_R}$$

This discrete-time IIR filter operates at a $f_{LO}/N$ sampling rate and introduces a single pole with attenuation of about 20 dB/dec, but not limited thereto. The IIR has better filtering performance than FIR, as set forth above, but the decimation normally leads to an aliasing problem, which can be minimized by the preceding MA filter.

If the sampling rate remains too high and further decimation is needed, redundant $C_R$ capacitors should be added and paralleled with the original ones. Input charge cyclically integrating in the parallel bank of $C_R$'s by the non-overlapping multi-phase clocks creates additional spatial MA filter, as set forth above, which can solve the aforementioned aliasing problem.

Similarly, the transfer function of the aforementioned second IIR filter is:

$$|H_{IIR2}(f)| = \left|\frac{1 - a_2}{1 - a_2 e^{-j\frac{2N\pi f}{f_{LO}}}}\right|,$$

where $$a_2 = \frac{c_B}{2c_R + c_B}$$

According to the transfer functions as set forth above, by setting the aforementioned $f_{LO}$ and N, we can set the frequency band of wireless transmission to different air interfaces.

In other words, by reconfiguring the aforementioned $f_{LO}$ and N, the system can utilize non-wideband transceiver hardware to support open wireless air interfaces of various different wireless standards.

The LNTA, DSMF and multi-phase clock generator, as set forth above, can be integrated into one system-on-chip (SoC) chipset for the aforementioned RF front-end.

The aforementioned DSMF performs the functions of down-conversion, decimation and filtering. Down-conversion is performed by charge sampling with sampling capacitors. Decimation and filtering are performed by the embedded switched capacitor filters.

In the aforementioned DSMF, the switches and capacitors can handle large signals and wide range of frequency bands especially in the charge domain. So the bandwidth and linearity will be greatly improved and optimized. In the aforementioned LNTA, by optimizing the balun amplifier based on common-gate common-source topology, we can achieve the best performance of wideband input matching, wide range frequency bands, and cancellation of both noise and nonlinearity.

SUMMARY OF THE PRESENT INVENTION

In summary, the present invention comprises the following disclosures:

Architecture of low noise transconductance amplifier (LNTA) for open wireless architecture (OWA) radio frequency (RF) front-end comprises:
a) Balun stage unit converting an un-balanced (single-ended) RF signal to a balanced about ground (differential) RF signal, and amplifying the aforementioned RF signal with low noise and good input matching and linearity performance,
b) Transconductance stage unit facilitating output current proportional to its input voltage or current change at output proportional to its voltage change at input, and
c) Buffer stage unit inserted between the aforementioned balun stage unit and the aforementioned transconductance stage unit to reduce phase and magnitude imbalance between them especially in the high-frequency portion of the band.

The aforementioned balun stage unit comprises two NMOS (N-type metal-oxide-semiconductor) transistors for balun amplifier wherein first load resistance $R_1$ of first NMOS transistor M1 is chosen to be several times, for example three times, of second load resistance $R_2$ of second NMOS transistor M2, while $g_m$ (the ratio of current change at output port to voltage change at input port) to the aforementioned M2 is same times of $g_m$ to the aforementioned M1, to achieve low noise performance for the aforementioned LNTA.

The aforementioned transconductance stage unit comprises two NMOS transistors and two PMOS (P-type metal-oxide-semiconductor) transistors for transconductor wherein the sizes of the aforementioned NMOS transistors and the aforementioned PMOS transistors are large enough to obtain a sufficient transconductance.

The aforementioned Balun stage unit, the aforementioned Transconductance stage unit and the aforementioned Buffer stage unit are not limited to any frequency bands or processing bandwidth of common wireless communications of different wireless air-interfaces, which can support frequency bands of at least from 500 MHz to 6 GHz and transmission bandwidth of at least from hundreds of kHz to tens of MHz.

The aforementioned balun stage unit utilizes common-gate common-source amplifier topology for its good features of wideband input matching and cancelling of both noise and nonlinearity.

Architecture of direct sampling mixer with discrete-time filtering (DSMF) for open wireless architecture (OWA) radio frequency (RF) front-end comprises:

a) LO (local oscillator) switch unit switching amplified balanced RF current from transconductance stage by the aforementioned LO signal, and integrating into sampling capacitors $C_H$ and $C_R$, which forms charge sampling, b) Sampling and Rotating unit distributing integrated charge between the aforementioned sampling capacitors $C_H$ and $C_R$ (or call $C_R$ as rotating capacitor and $C_H$ as history capacitor) at a rate of $f_{LO}/N$ (frequency of LO clock/N samples) switched by clocks $SA_{1,2}$, $SB_{1,2}$ (SA1, SA2, SB1, SB2) which forms first IIR (infinite impulse response) filter, c) Output buffering unit reading combination charge stored in the aforementioned $C_R$ (including group $C_{R1}$, $C_{R2}$ and group $C_{R3}$, $C_{R4}$) out into output buffer capacitor $C_B$ at an even lower rate $f_{LO}/(2N)$ switched by clock SAZ (for the aforementioned $C_{R1}$, $C_{R2}$) and clock SA (for the aforementioned $C_{R3}$, $C_{R4}$), wherein N is the ratio of $f_{LO}/f_{CLK}$ (frequency of local oscillator/frequency of clock), which forms second IIR (infinite impulse response) filter, and d) Discharge and DC (direct current) reset unit providing proper IF (intermediate frequency) voltage output from the aforementioned DSMF to following IF systems including analog to digital converter.

The aforementioned LO switch uses CMOS (complementary metal-oxide-semiconductor) switch to reduce and stabilize on-resistance even under large input signal conditions.

The aforementioned sampling capacitor is large to reduce sampling noise and clock feedthrough.

The aforementioned clocks $SA_{1,2}$, $SB_{1,2}$ have non-overlapping time windows that let successive the aforementioned N samples be integrated into the aforementioned sampling capacitors.

The ratio between the aforementioned sampling capacitor and the aforementioned rotating capacitor $C_H/C_R$ is not chosen to be too large in order to have the potential to tune bandwidth from hundreds of KHz to tens of MHz and prevent the aforementioned first IIR filter from limiting the aforementioned IF bandwidth.

The aforementioned non-overlapping clocks $SA_{1,2}$ successively transfer/switch incoming charge into the aforementioned parallel rotating capacitors $C_{R1}$ and $C_{R2}$, which provides additional decimation by two that is the second order spacial moving average, and the aforementioned parallel rotating capacitors $C_{R3}$ and $C_{R4}$ repeat same process as the aforementioned $C_{R1}$ and $C_{R2}$, but are switched by the aforementioned non-overlapping clocks $SB_{1,2}$.

By setting the aforementioned $f_{LO}$ and the aforementioned N, specific frequency band can be set for wireless transmission of different air interfaces wherein, by reconfiguring the aforementioned $f_{LO}$ and the aforementioned N, the aforementioned OWA system can utilize non-wideband transceiver hardware to support open wireless air interfaces of various different wireless standards.

The aforementioned $C_{R1}$ and the aforementioned $C_{R2}$ are discharged by reset clock $R_{es}$ and are reset to a common voltage $V_{cm}$, which is at the same level as DC (direct current) common output voltage of transconductor stage to prevent DC current from flowing through the aforementioned sampling mixer and the aforementioned discrete-time filter in order to eliminate flicker noise, and the aforementioned $C_{R3}$ and the aforementioned $C_{R4}$ are discharged in the same way as the aforementioned $C_{R1}$ and the aforementioned $C_{R2}$, but by reset clock $R_{esz}$.

The aforementioned $C_H$, the aforementioned $C_R$ and the aforementioned $C_B$ are connected between two differential paths instead of connecting one of their terminals to ground to reduce number of capacitors needed and save capacitance area by a factor of four.

The aforementioned clocks SA1, SA2, SB1, SB2, SA, SAZ, $R_{es}$ and $R_{esz}$ are provided by multi-phase clock generator, and wherein SA1=SA, SA2=$R_{esz}$, SAZ=SB1 and SB2=$R_{es}$.

The frequency of the aforementioned clocks SA1, SA2, SB1, SB2, SA, SAZ, $R_{es}$ and $R_{esz}$ is $f_{CLK}=f_{LO}/N$) wherein all of the aforementioned clocks are not overlapped each other, and their initial ON time window (clock occurs in ON/OFF manner) occurs in the sequence order of the aforementioned SA1(SA), SA2($R_{esz}$), SAZ(SB1) and SB2($R_{es}$).

The aforementioned RF front-end first searches for RF frequency band of wireless air-interface of wireless system and then calculates the aforementioned required $f_{LO}$ and N to generate the aforementioned proper clocks, and the aforementioned RF front-end is locked to the aforementioned frequency band and provides necessary bandwidth for processing of required RF and IF signals wherein the aforementioned RF front-end remains non-broadband RF hardware including narrow-band RF hardware and regular RF hardware.

Redundant the aforementioned $C_R$ capacitors should be added and paralleled with original ones if sampling rate remains too high and further decimation is needed, and input charge cyclically integrating in parallel bank of the aforementioned $C_R$ capacitors by the aforementioned non-overlapping multi-phase clocks creates additional spatial moving-average filtering, which can solve an aliasing problem in the aforementioned first IIR filter.

The aforementioned charge sampling integrates current from transconductor into the aforementioned sampling capacitors without tracking signal voltage wherein, the aforementioned transconductor can provide an almost constant output current across very wide frequency bands up to 10 GHz to charge the aforementioned sampling capacitors, and the value of capacitance can be so large that both noise and clock/charge feedthrough are largely reduced.

The aforementioned common voltage $V_m$ also provides DC common input voltage to following IF (intermediate frequency) subsystems to ease the aforementioned IF system implementation and complexity.

The aforementioned LNTA and DSMF can have different schematic circuits, but with same or similar functional units to provide simplified and high-performance RF front-end for the aforementioned OWA RF transceiver.

The present invention is part of the proprietary Open Wireless Architecture (OWA)® technology development projects initially invented in 2002, further developed in versions of 2004 and 2006, etc, and has continuously been developed and improved since year 2002.

Since many modifications, variations and changes in detail can be made to the described preferred embodiment of the invention, it is intended that all matters in the foregoing description and shown in the accompanying drawings be interpreted as illustrative and not in a limiting sense. Thus, the scope of the invention should be determined by the appended claims and their legal equivalents.

What is claimed is:

1. Architecture of direct sampling mixer with discrete-time filtering (DSMF) for open wireless architecture (OWA) radio frequency (RF) front-end, said architecture comprising:
   a) LO (local oscillator) switch unit switching amplified balanced RF current from transconductance stage by LO signal, and integrating into sampling capacitors $C_H$ and $C_R$, which forms charge sampling,
   b) Sampling and Rotating unit distributing integrated charge between said sampling capacitors $C_H$ and $C_R$ wherein $C_R$ is a rotating capacitor and $C_H$ is a history capacitor at a frequency of $f_{LO}/N$ (frequency of LO clock/N samples) switched by clocks $SA_{1,2}$, $SB_{1,2}$ including clocks SA1, SA2, SB1, SB2 which forms first IIR (infinite impulse response) filter,
   c) Output buffering unit reading combination charge stored in said $C_R$ including group of parallel rotating capacitors $C_{R1}$, $C_{R2}$ and group of parallel rotating capacitors $C_{R3}$, $C_{R4}$ out into output buffer capacitor $C_B$ at an even lower frequency $f_{LO}/(2N)$ switched by clock SAZ for said $C_{R1}$, $C_{R2}$ and clock SA for said $C_{R3}$, $C_{R4}$, wherein N is the ratio of $f_{LO}/f_{CLK}$ (frequency of local oscillator/frequency of clock), which forms second IIR (infinite impulse response) filter, and
   d) Discharge and DC (direct current) reset unit providing proper IF (intermediate frequency) voltage output from said DSMF to following IF systems including analog to digital converter.

2. Said architecture as recited in claim 1, wherein said transconductance stage comprises two NMOS (N-type metal-oxide-semiconductor) transistors and two PMOS (P-type metal-oxide-semiconductor) transistors for transconductor wherein the sizes of said NMOS transistors and said PMOS transistors are large enough to obtain a sufficient transconductance.

3. Said architecture as recited in claim 1, wherein said Transconductance stage is not limited to any frequency bands or processing bandwidth of common wireless communications of different wireless air-interfaces, which can support frequency bands of at least from 500 MHz to 6 GHz and transmission bandwidth of at least from hundreds of kHz to tens of MHz.

4. Said architecture as recited in claim 1, wherein said LO switch unit uses CMOS (complementary metal-oxide-semiconductor) switch to reduce and stabilize on-resistance even under large input signal conditions.

5. Said architecture as recited in claim 1, wherein said sampling capacitor is large to reduce sampling noise and clock feedthrough.

6. Said architecture as recited in claim 1, wherein said clocks $SA_{1,2}$, $SB_{1,2}$ have non-overlapping time windows that let successive said N samples be integrated into said sampling capacitors.

7. Said architecture as recited in claim 1, wherein the ratio between said history capacitor and said rotating capacitor $C_H/C_R$ is not chosen to be too large in order to have the potential to tune bandwidth from hundreds of KHz to tens of MHz and prevent said first IIR filter from limiting IF bandwidth.

8. Said architecture as recited in claim 1, wherein said non-overlapping clocks $SA_{1,2}$ successively transfer/switch incoming charge into said parallel rotating capacitors $C_{R1}$ and $C_{R2}$, which provides additional decimation by two that is the second order spacial moving average, and said parallel rotating capacitors $C_{R3}$ and $C_{R4}$ repeat same process as said $C_{R1}$ and $C_{R2}$, but are switched by said non-overlapping clocks $SB_{1,2}$.

9. Said architecture as recited in claim 1, wherein by setting said $f_{LO}$ and said N, specific frequency band can be set for wireless transmission of different air interfaces wherein, by reconfiguring said $f_{LO}$ and said N, said OWA system can utilize non-wideband transceiver hardware to support open wireless air interfaces of various different wireless standards.

10. Said architecture as recited in claim 1, wherein said $C_{R1}$ and said $C_{R2}$ are discharged by reset clock $R_{es}$ and are reset to a common voltage $V_{cm}$, which is at the same level as DC (direct current) common output voltage of said transconductance stage to prevent DC current from flowing through said sampling mixer and said discrete-time filter in order to eliminate flicker noise, and said $C_{R3}$ and said $C_{R4}$ are discharged in the same way as said $C_{R1}$ and said $C_{R2}$, but by reset clock $R_{esz}$.

11. Said architecture as recited in claim 10, wherein said clocks SA1, SA2, SB1, SB2, SA, SAZ, $R_{es}$ and $R_{esz}$ are provided by multi-phase clock generator, and wherein SA1=SA, SA2=$R_{esz}$, SAZ=SB1 and SB2=$R_{es}$.

12. Said architecture as recited in claim 10, wherein the frequency of said clocks SA1, SA2, SB1, SB2, SA, SAZ, $R_{es}$ and $R_{esz}$ is $f_{CLK}=f_{LO}/N$, wherein all of said clocks are not overlapped each other, and their initial ON time window (clock occurs in ON/OFF manner) occurs in the sequence order of said SA1(SA), SA2($R_{esz}$), SAZ(SB1) and SB2($R_{es}$).

13. Said architecture as recited in claim 10, wherein said common voltage $V_{cm}$ also provides DC common input voltage to following IF (intermediate frequency) subsystems to ease system implementation and complexity.

14. Said architecture as recited in claim 1, wherein said $C_H$, said $C_R$ and said $C_B$ are connected between two differential paths instead of connecting one of their terminals to ground to reduce number of capacitors needed and save capacitance area by a factor of four.

15. Said architecture as recited in claim 1, wherein said RF front-end first searches for RF frequency band of wireless air-interface of wireless system and then calculates required $f_{LO}$ and N to generate said proper clocks, and said RF front-end is locked to said frequency band and provides necessary bandwidth for processing of required RF and IF signals.

16. Said architecture as recited in claim 1, wherein redundant said $C_R$ capacitors should be added and paralleled with original ones if sampling rate remains too high and further decimation is needed, and input charge cyclically integrating in parallel bank of said $C_R$ capacitors by non-overlapping multi-phase clocks creates additional spatial moving-average filtering, which can solve an aliasing problem in said first IIR filter.

17. Said architecture as recited in claim 1, wherein said charge sampling integrates current from said transconductance stage into said sampling capacitors without tracking signal voltage wherein, said transconductance stage can provide an almost constant output current across very wide frequency bands up to 10 GHz to charge said sampling capacitors, and the value of capacitance can be so large that both noise and clock/charge feedthrough are largely reduced.

* * * * *